United States Patent [19]

Shergov et al.

[11] 4,097,714
[45] Jun. 27, 1978

[54] THERMIONIC HEATER CATHODE ASSEMBLY OF ELECTRON-BEAM GUN

[76] Inventors: Igor Vladimirovich Shergov, Festivalnaya ulitsa, 75, kv. 108; Sergei Nikolaevich Melbard, ulitsa Akademika Pavlova, 50, kv. 42, both of, Moscow, U.S.S.R.

[21] Appl. No.: 795,504

[22] Filed: May 10, 1977

[51] Int. Cl.² .............................................. B23K 9/00
[52] U.S. Cl. .............................. 219/121 EB; 313/337; 313/346 R
[58] Field of Search ............ 313/337, 346 DC, 346 R; 219/121 EB, 121 EM

[56] References Cited

U.S. PATENT DOCUMENTS 3,389,290   6/1968   Yosida et al. ..................... 313/346 R

*Primary Examiner*—J. V. Truhe
*Assistant Examiner*—Fred E. Bell
*Attorney, Agent, or Firm*—Fleit & Jacobson

[57] ABSTRACT

A thermionic heater cathode assembly of an electron-beam gun, comprising a disc cathode made of a highly-emissive material and disposed near a U-shaped ribbon filament with a thermionic portion and current-carrying sections arranged in parallel, wherein the ends of said ribbon filament sections to be connected to a holder are arranged in a plane normal to the ends of the same sections, adjoining the thermionic portion of said ribbon filament.

1 Claim, 2 Drawing Figures

THERMIONIC HEATER CATHODE ASSEMBLY OF ELECTRON-BEAM GUN

The present invention relates to electron-beam engineering equipment wherein a high-energy electron beam is used as a working tool, and more particularly, to a thermionic heater cathode assembly of an electron-beam gun, the cathode whereof made of a highly-emissive material is heated by a filament.

The term "electron-beam gun" is used to denote a plurality of electrodes producing and defining an electron beam, and also controlling its intensity. The electron-beam gun operates from a high-voltage DC power source.

The thermionic heater cathode assembly of the present invention can most advantageously be employed for welding, fusion and other types of metal working based on electron-beam techniques.

Experience has shown that operation of electron-beam guns, accompanied by waste gas pressure variations, requires that flat disc cathodes manufactured from a highly-emissive material be used. To achieve stable electron emission, the cathode must be heated to a temperature of 1,800° to 2,000° C, with the heating temperature being maintained uniform and stable to a high degree. This requirement can be satisfied only by providing an efficient heater with such economy features as low power consumption, high resistance to deformation at elevated temperatures, and durability even when overheated. It has been found by experience that coil filaments with an axial lead meet these requirements to a certain extent. However, in high-power electron-beam guns, such filaments are not durable due to variations in turn-to-turn distances, non-uniform heating and turn-to-turn short-circuits.

Owing to the high power of the beam produced by known electron-beam guns incorporating said filament, even minor changes in the initial shape of the coil and in the turn-to-turn distances occurring during manufacture and assembly of the cathode elements bring about non-uniform heating of the disc cathode, temperature variation during operating of said cathode, and non-uniform emission from the heated surface thereof.

It has previously been proposed that coil holding insulators be employed to increase the resistance to deformation of the coil. However, this measure does not obviate all of the above disadvantages, impairs the cooling conditions of the thermionic cathode assembly, and complicates alignment of the coil in relation to the electrodes of said assembly. Besides, the heat energy cannot be focused in the center of the disc cathode because the area of the heated coil is large.

In recent years, a ribbon filament has been proposed, the thermionic portion thereof is near the centre of the disc cathode.

It is an object of the present invention to increase the power of an electron-beam gun.

Another object of this invention is to provide a thermionic heater cathode assembly of an electron-beam gun, the ribbon filament whereof has a maximum efficiency.

Still another object of this invention is to minimize the temperature of the ribbon filament current-carrying sections.

These objects are attained by providing a thermionic heater cathode assembly of an electron-beam gun, comprising a disc cathode made of a highly-emissive material, and a U-shaped ribbon filament with a thermionic portion and current-carrying sections arranged in parallel, wherein the section ends connected to a holder lie, according to the invention, in a plane normal to the ends of the same sections, adjoining the thermionic portion.

An important advantage of the present invention is that mutual heating of the parallel sections is decreased by 30 percent because they face each other only by the narrow sides over half the length thereof.

These and other objects and advantages of the present invention will become more fully apparent from the following detailed description of a preferred embodiment thereof taken in conjunction with the accompanying drawings, wherein.

Figure 1:
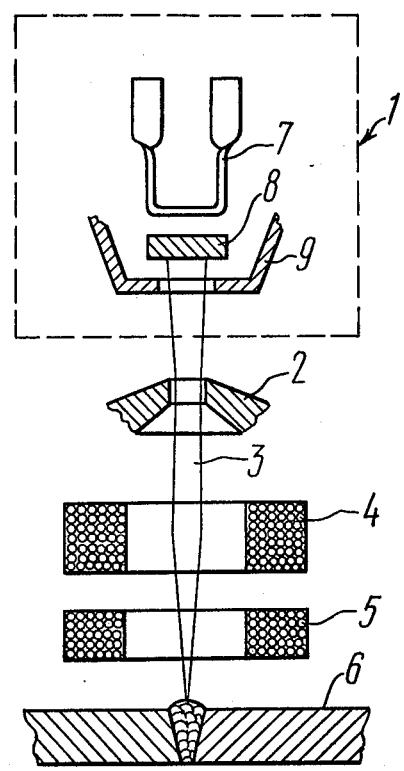
FIG. 1 is a schematic diagram of an electron-beam gun incorporating a thermionic heater cathode assembly, according to the present invention, with a workpiece to be welded.
Figure 2:
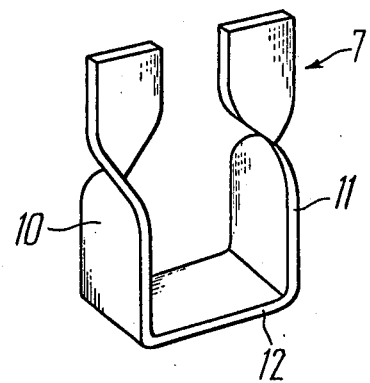
FIG. 2 is an enlarged axonometric view of the ribbon filament.

Referring now to FIG. 1, an electron-beam gun fitted to a metal welding machine (not shown) comprises a thermionic heater cathode assembly 1 and an anode 2 intended for producing an electron beam 3. An electromagnetic focusing lens 4, a centring system 5 and finally, a workpiece 6 to be welded are placed along the electron beam.

The thermionic heater cathode assembly 1 includes a ribbon filament 7 given a U-shape, made of tantalum and disposed near a disc cathode 8 made of lanthalum hexaboride and axially aligned with a control electrode 9. The function of the control electrode is to regulate electron beam intensity.

Each pair of parallel current-carrying sections 10 and 11 of the ribbon filament 7 is twisted in the centre thereof so that the cross-sections of both halves form an angle of 90°.

A thermionic portion 12 of the ribbon filament 7 adjoins, at 90° ends of the parallel sections 10 and 11 and is parallel to the disc cathode 8, while the opposite ends of the sections 10 and 11 are connected to a holder (not shown).

In operation, the workpiece 6, is placed in a vacuum chamber (not shown) and is exposed to a thin focused beam 3 of electrons moving at a velocity near to that of light. The electron beam interacting with the item 6 causes heating and fusion of the metal being worked.

The disc cathode 8 heated by the ribbon filament 7 constitutes a source of free electrons. The disc cathode 8 is heated under bambardment by electron emitted by the thermionic portion 12 of the ribbon filament 7. The heating temperature reaches 2,200° C. The disc cathode 8 is at a positive potential in relation to the ribbon filament 7, which is essential for increasing the velocity of electrons and the intensity of bombardment of the disc cathode 8. The disc cathode is heated both by thermal radiation of the ribbon filament 7, and by the impact of the electron beam on the body of the disc cathode 8. Owing to the high temperature and electron bombardment, the material of the disc cathode 12 starts evaporating, reaches the thermionic portion 12 of the ribbon filament 7, activates said portion, and reduces its electronic surface work function. Since the cross-section of one half of each sections 10 and 11 of the ribbon filament is normal to that of the other half of the same section mutual heating of the sections 10 and 11 is reduced, with said cross sections of the sections 10 and 11 facing each other by the narrow sides thereof. Consequently, the thermal flux directed by the narrow side on the adjacent section is much less than that radiated by the wide side of the same cross section. Experience shows that the total heat exchanged between the sections 10 and 11 is reduced by 30 percent. Besides, the wide side of said cross section is cooled easily, with heat being radiated into the surrounding space.

The decrease in temperature of the cathode assembly 1 contributes to a higher resistance to deformation of the ribbon filament 7, and also to stable heating of the disc cathode 8.

The high electron energy is achieved by accelerating electrons by a high-voltage field produced by the anode 2. The energy is supplied by pulses with a duration of $10^{-4}$ to $10^{-6}$ sec. Upon impact of the electron beam on the surface of the workpiece 6, the electron energy is converted into heat. Thus, the temperature in the area where the beam contacts the workpiece (contact spots) rises to 3,000° to 4,000° C.

The invention permits increasing the service life of the ribbon filament to 12 hours, and reducing the power drained by the filament to 70 W. The decrease in heat exchange due to rediation of the current-carrying sections of the filament results in a 3-fold increase in resistance to deformation of the filament in the course of operation.

What is claimed is:

1. A thermionic heater cathode assembly of a welding electron-beam gun, comprising: a disc cathode made of a highlyemissive material; a U-shaped ribbon filament with a thermionic portion and current-carrying sections arranged in parallel near said disc cathode; a holder connected to ends of the current-carrying sections of said ribbon filament; the ends of said ribbon filament sections, connected to the holder lying in a plane normal to the ends of the same section, adjoining the thermionic portion of said ribbon filament.

* * * * *